US012604444B2

(12) United States Patent
Ziegler, IV et al.

(10) Patent No.: US 12,604,444 B2
(45) Date of Patent: Apr. 14, 2026

(54) ELECTROMAGNETIC INTERFERENCE PROTECTION DOOR FOR DATA PROCESSING SYSTEMS

(71) Applicant: Dell Products L.P., Round Rock, TX (US)

(72) Inventors: Charles William Ziegler, IV, East Providence, RI (US); Jason Pritchard, Hopkinton, MA (US)

(73) Assignee: Dell Products L.P., Round Rock, TX (US)

( * ) Notice: Subject to any disclaimer, the term of this patent is extended or adjusted under 35 U.S.C. 154(b) by 225 days.

(21) Appl. No.: 18/647,316

(22) Filed: Apr. 26, 2024

(65) Prior Publication Data

US 2025/0338463 A1     Oct. 30, 2025

(51) Int. Cl.
*H05K 9/00* (2006.01)
*G06F 1/16* (2006.01)

(52) U.S. Cl.
CPC ......... *H05K 9/0007* (2013.01); *G06F 1/1656* (2013.01)

(58) Field of Classification Search
CPC ..... G06F 1/182; G06F 1/1656; H05K 9/0007; H05K 9/0018; H05K 9/0081; H05K 9/0024; H05K 9/0098
See application file for complete search history.

(56) References Cited

U.S. PATENT DOCUMENTS 3,830,954 A * 8/1974 Caudill ................ H05K 9/0018
174/362
5,693,908 A * 12/1997 Amberger ................ H02G 3/14
361/825

6,162,989 A * 12/2000 Garner ................. H05K 9/0018
174/358
2011/0242787 A1 * 10/2011 Jaze ..................... H05K 9/0018
361/818
2013/0228657 A1 * 9/2013 Sprenger ................. H02G 3/08
248/56
2013/0277102 A1 * 10/2013 Arceneaux ........... H05K 9/0018
174/382
2015/0181771 A1 * 6/2015 Frana ................... H05K 9/0018
361/818
2022/0240409 A1 * 7/2022 Doglio ............... H04M 1/0277

FOREIGN PATENT DOCUMENTS

GB          2591852 A * 8/2021 .......... H02G 15/064

* cited by examiner

*Primary Examiner* — Abhishek M Rathod
(74) *Attorney, Agent, or Firm* — WOMBLE BOND DICKINSON (US) LLP

(57)          ABSTRACT

Devices, systems, and methods for managing data processing systems are disclosed. A data processing system may include hardware components that may communicate with other hardware components of other data processing systems via a communication cable. To exit an enclosure of the data processing system, the communication cable may pass through an electromagnetic interference (EMI) protection door of the data processing system. The EMI protection door may include a first portion and a second portion. The first portion and the second portion may include a conductive material that may form an EMI seal with the communication cable when the EMI protection door is closed and the communication cable is positioned in a gap between the first portion and the second portion. The EMI protection door may include at least a first hinge to move the EMI protection door between an open position and a closed position.

20 Claims, 7 Drawing Sheets

ELECTROMAGNETIC INTERFERENCE PROTECTION DOOR FOR DATA PROCESSING SYSTEMS

FIELD OF THE DISCLOSURE

Embodiments disclosed herein generally relate to a device management. More particularly, embodiments disclosed herein relate to systems and methods for managing electromagnetic interference (EMI) protection for data processing systems.

BACKGROUND

Computing devices may provide various types of computer-implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
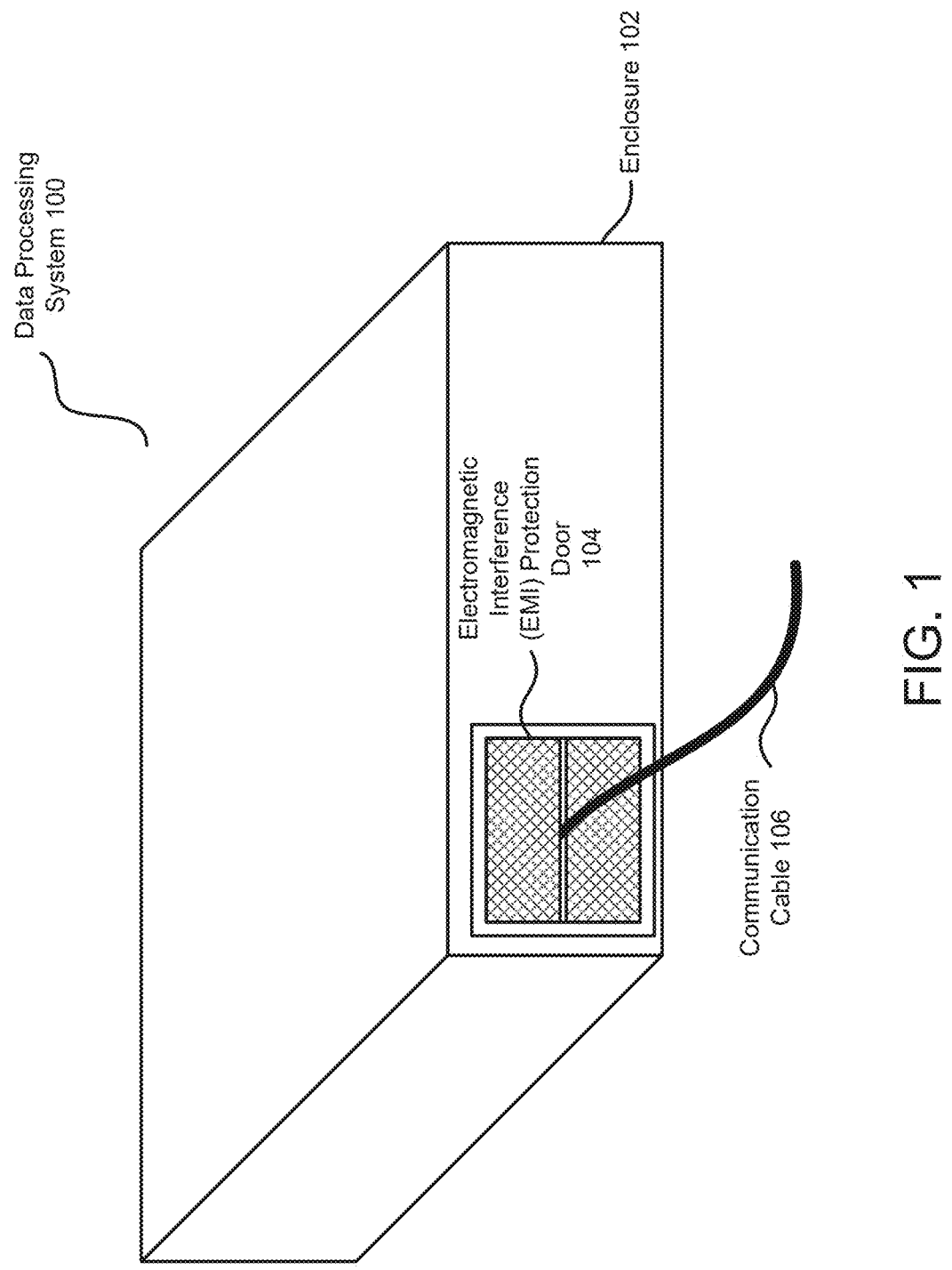
FIG. 1 shows a diagram illustrating a data processing system in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to devices, systems, and methods for managing data processing systems that may provide computer-implemented services. To provide the computer-implemented services, the data processing systems may include any number of hardware components. As part of providing the computer-implemented services, the hardware components of a first data processing system may communicate with other hardware components of a second data processing systems.

For example, a communication cable may operably connect a first hardware component positioned in a first enclosure of a first data processing system to a second hardware component positioned in a second enclosure of a second data processing system. By operably connecting the first hardware component and the second hardware component using the communication cable, information may be directly exchanged between the first hardware component and the second hardware component.

However, the first hardware component may not be electromagnetic interference (EMI) sealed to any walls of the first enclosure and, therefore, the communication cable may exit the first enclosure in order to operably connect to the second hardware component. If the communication cable exits the first enclosure through an opening (e.g., a hole) in the first enclosure, hardware components internal to the first enclosure may be vulnerable to EMI which may negatively impact operation of the first data processing system. If the operation of the first data processing system is negatively impacted, the computer-implemented services provided by at least the first data processing system may be interrupted and/or may otherwise be negatively impacted.

To operably connect the communication cable to the first hardware component and the second hardware component without exposing the first data processing system (e.g., internal components of the first data processing system) to EMI, the first enclosure may include an EMI protection door. The EMI protection door may be positioned with an opening in the first enclosure and may be adapted to conform a shape of a portion of the EMI protection door to a shape of a portion of the communication cable when the communication cable is positioned with the portion of the EMI protection door. The EMI protection door may include a conductive material (e.g., electrically conductive foam, electrically conductive filaments) and the conductive material may be included in the portion of the EMI protection door that conforms to the shape of the portion of the communication cable. By doing so, an EMI seal may be established between the portion of the EMI protection door and the portion of the communication cable.

Therefore, the communication cable may operably connect the first hardware component and the second hardware component while maintaining an EMI seal between the communication cable and the enclosure. Consequently, hardware components of the first data processing system may be protected from EMI which may negatively impact operation of the hardware components and/or provision of the computer-implemented services by the first data processing system.

In an embodiment, a data processing system is provided. The data processing system may include an enclosure; a hardware component positioned in an interior of the enclosure; a communication cable adapted to operably connect the hardware component to a second hardware component positioned in a second enclosure of a second data processing system; and an electromagnetic interference (EMI) protection door positioned with an opening in the enclosure, the EMI protection door being adapted to: conform a shape of a portion of the EMI protection door to a shape of a portion of the communication cable while the communication cable is positioned with the portion of the EMI protection door to establish an EMI seal between the portion of the EMI protection door and the portion of the communication cable.

The EMI protection door may include: a first portion, and a second portion; a first hinge connected to the first portion; and a second hinge connected to the second portion.

The first hinge and the second hinge may be positioned on opposite sides of a gap between the first portion and the second portion.

The EMI protection door may also include: a conductive material positioned to substantially fill the gap while the first hinge and the second hinge are in a first position.

The conductive material may include an electrically conductive foam.

The conductive material may include electrically conductive filaments.

The EMI protection door may also include: a frame adapted to establish a second EMI seal between the EMI protection door and the enclosure.

The EMI protection door may include: a first portion, and a second portion; and a hinge connected to the first portion and the second portion.

The first portion and the second portion may be separated by a gap, and the first portion and the second portion may be adapted to fill the gap while the communication cable is not positioned in the gap and conform to the shape of the portion of the communication cable while the communication cable is positioned in the gap.

The first portion may include a conductive material and the second portion may include the conductive material, the conductive material forming the EMI seal while the communication cable is positioned in the gap.

The hinge may be adapted to retain alignment of the first portion and the second portion as the first portion and the second portion rotate via the hinge.

The hardware component may not be EMI sealed to any walls of the enclosure. In an embodiment, an enclosure for a data processing system is provided, as discussed above.

Turning to FIG. 1, a diagram illustrating data processing system 100 in accordance with an embodiment is shown. Data processing system 100 may be used to provide any type and/or quantity of computer-implemented services. For example, the computer-implemented services may include data storage services, instant messaging services, database services, and/or any other type of service that may be implemented with a computing device.

To provide the computer-implemented services, data processing system 100 may include any number of hardware components (not shown) positioned in an interior of enclosure 102. These hardware components may facilitate various functionalities of data processing system 100 while providing the computer-implemented services.

For example, a first hardware component may communicate with other hardware components of other data processing systems as part of providing its functionality. The hardware component may be operably connected to the other hardware components via communication cable 106 shown in FIG. 1 to transmit and receive data while providing the computer-implemented services. By directly connecting the hardware components with communication cable 106, network bandwidth of data processing system 100 may be conserved, as the hardware components may exchange a large volume of data while providing the computer-implemented services.

However, the hardware component of data processing system 100 may not be EMI sealed to any walls of enclosure 102 to conserve space on the walls of enclosure 102 for other uses, etc. Therefore, communication cable 106 may exit enclosure 102 via an opening in enclosure 102. Any opening in enclosure 102 may increase a risk of EMI for components of data processing system 100. EMI (e.g., unexpected interference in an electrical path or circuit from an electromagnetic field source such as another electrical device, solar flares, etc.) may interfere with and, therefore, negatively impact operation of hardware components of data processing system 100. Consequently, the computer-implemented services provided by data processing system 100 may be negatively impacted and/or may become unavailable.

In general, embodiments disclosed herein relate to systems, devices, and methods for managing data processing systems so that negative impacts of EMI on the computer-implemented services may be reduced while a hardware component of a first data processing system is operably connected to other hardware components of other data processing systems. To do so, data processing system 100 may include: (i) enclosure 102, (ii) EMI protection door 104, and (iii) communication cable 106. While described herein as including enclosure 102, EMI protection door 104, and communication cable 106, it may be appreciated that data processing system 100 may include other components without departing from embodiments herein. Each of these components is described below.

Enclosure 102 may be a physical device for housing components such as hardware components. For example, enclosure 102 may be a computer chassis to protect hardware components of data processing system 100.

Communication cable 106 may be any cable through which data may be transmitted between two computing devices. For example, communication cable 106 may include: (i) a twisted pair cable, (ii) a coaxial cable, (iii) a fiber optic cable, and/or (iv) other types of cables that may physically connect a component of data processing system 100 to a component of another data processing system at least for the purpose of exchanging data.

Communication cable 106 may exit enclosure 102 via EMI protection door 104. EMI protection door 104 may be positioned with an opening in enclosure 102 to establish an EMI seal with communication cable 106. To do so, EMI protection door 104 may include: (i) a first portion, (ii) a second portion, (iii) at least a first hinge, and (iv) a frame.

The first portion and the second portion may include a conductive material and when EMI protection door 104 is closed, the conductive material may form an EMI seal with communication cable 106. The conductive material may include: (i) electrically conductive foam, (ii) electrically conductive filaments, and/or (iii) other conductive materials.

The electrically conductive foam may be any EMI shielding foam material (e.g., an open cell metal foam) that has flexible properties so that the electrically conductive foam may conform to different shapes. The electrically conductive filaments may include any number of thread-like metal pieces (e.g., metal bristles). The electrically conductive filaments may be densely populated in an area of the first portion and the second portion so that the electrically conductive filaments may fill an area around an object while conforming to a shape of the object thereby maintaining an EMI seal around the object (e.g., communication cable 106).

The first portion and the second portion may be separated by a gap. For communication cable 106 to exit enclosure 102, communication cable 106 may be positioned in the gap. The first portion and the second portion may be adapted to fill the gap when communication cable 106 is not positioned in the gap and the first portion and the second portion may conform to a shape of a portion of communication cable 106 (e.g., the portion positioned in the gap) when communication cable 106 is positioned in the gap.

To insert communication cable 106 through EMI protection door 104, EMI protection door 104 may open via at least one hinge. In a first example, EMI protection door 104 may include the first hinge and a second hinge. The first hinge may be connected to the first portion and the second hinge may be connected to the second portion. The first hinge and the second hinge may be in a first position when EMI protection door 104 is closed and the first hinge and the second hinge may be in a second position when EMI protection door 104 is open.

The first hinge may be any moveable joint that allows the first portion to rotate along with the first hinge when the first hinge moves from the first position to the second position. Specifically, a first portion of the first hinge may be attached to a frame of EMI protection door 104 (and/or a wall of enclosure 102) and may be in a fixed position (e.g., may not move when the first hinge moves from the first position to the second position. A second portion of the first hinge may be attached to the first portion of EMI protection door 104 so that when the moveable joint moves from the first position to the second position, the first portion of EMI protection door 104 moves along with the second portion of the first hinge. The second hinge may be similar to the first hinge.

Figures 3A, 3B:
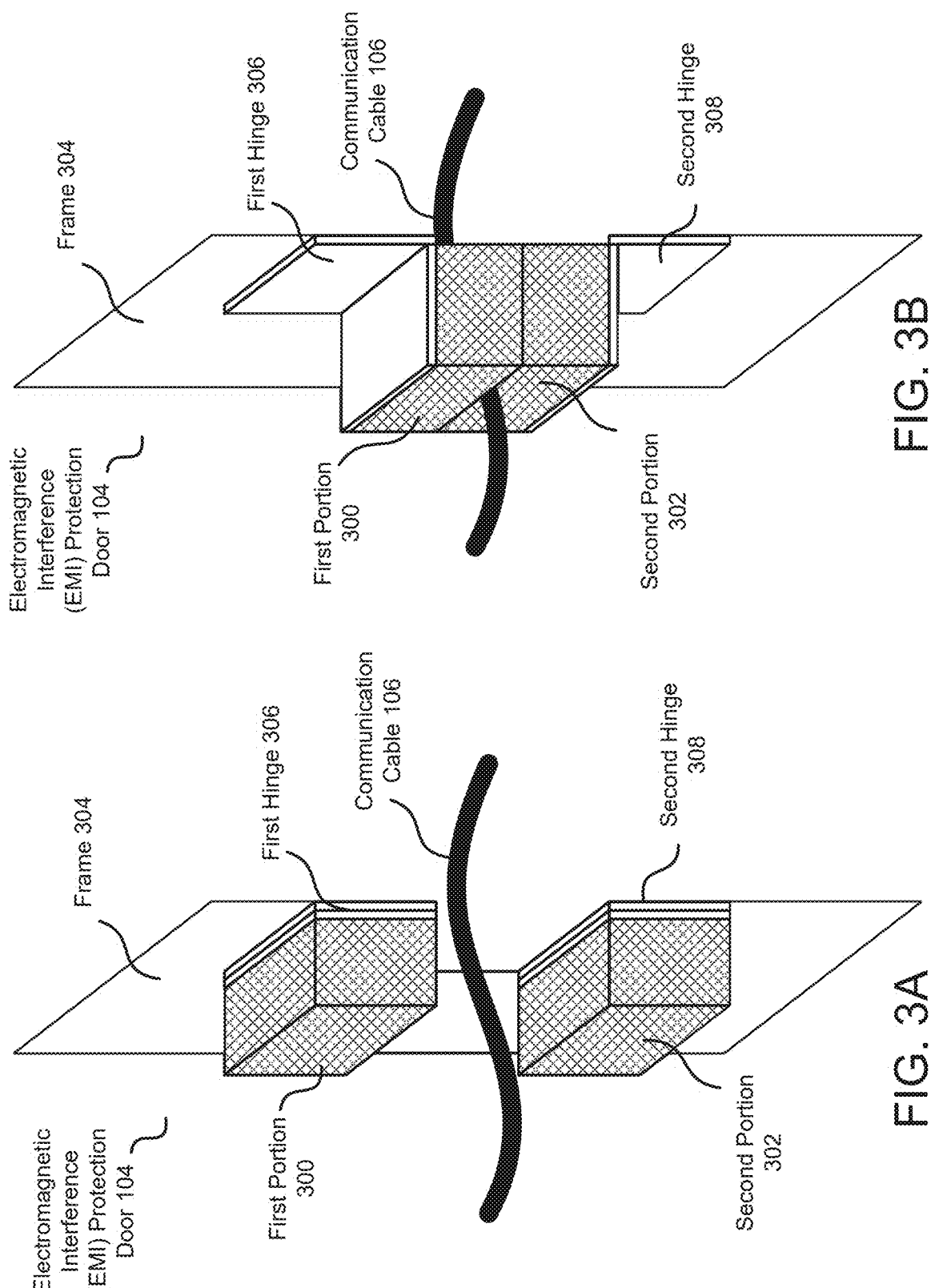
FIGS. 3A-3E show diagrams illustrating an electromagnetic interference (EMI) protection door and components thereof in accordance with an embodiment.

Refer to FIGS. 3A-3B for additional details regarding EMI protection door 104 including the first hinge and the second hinge.

Figures 3C, 3D:
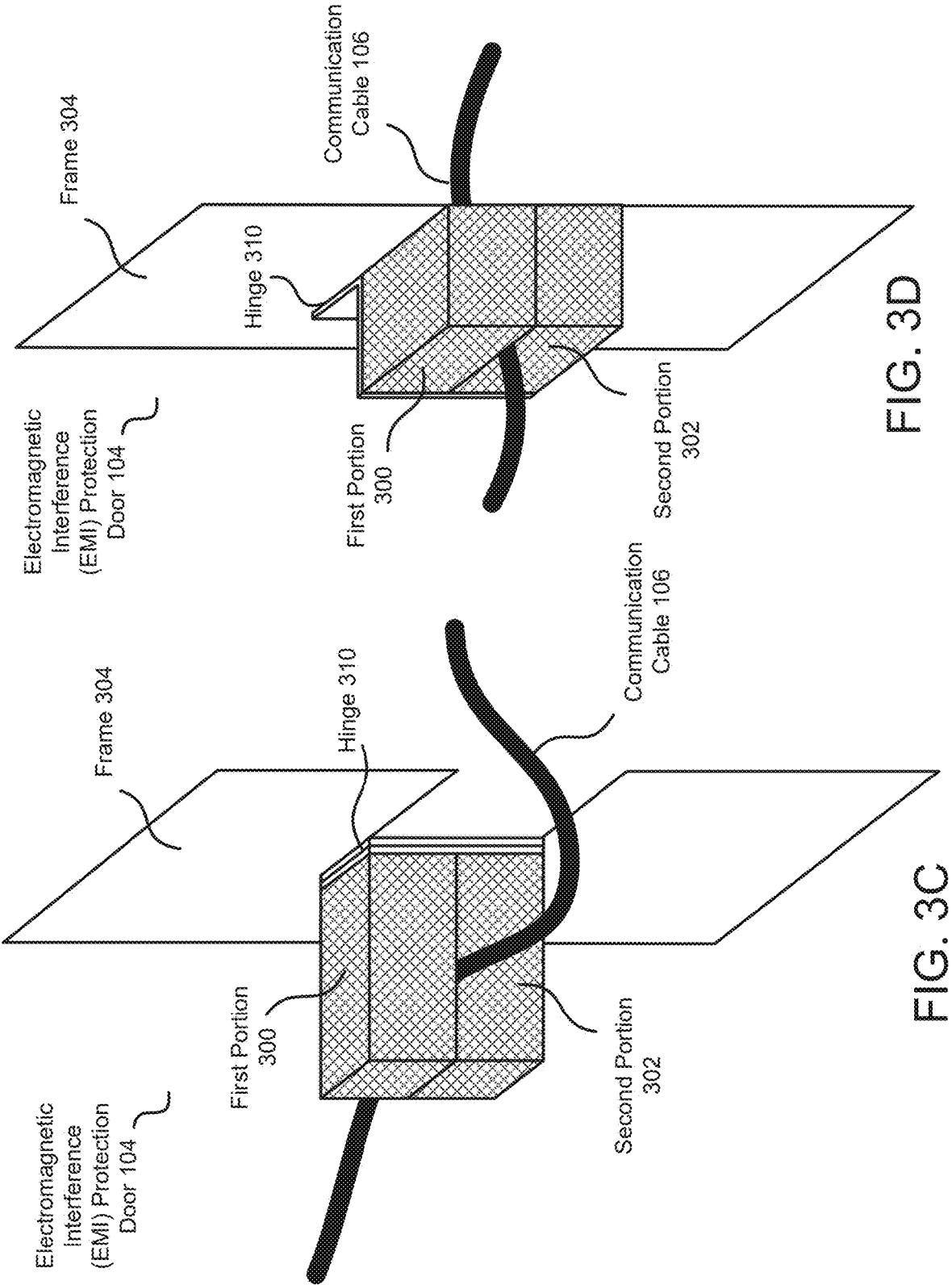
Figure 3E:
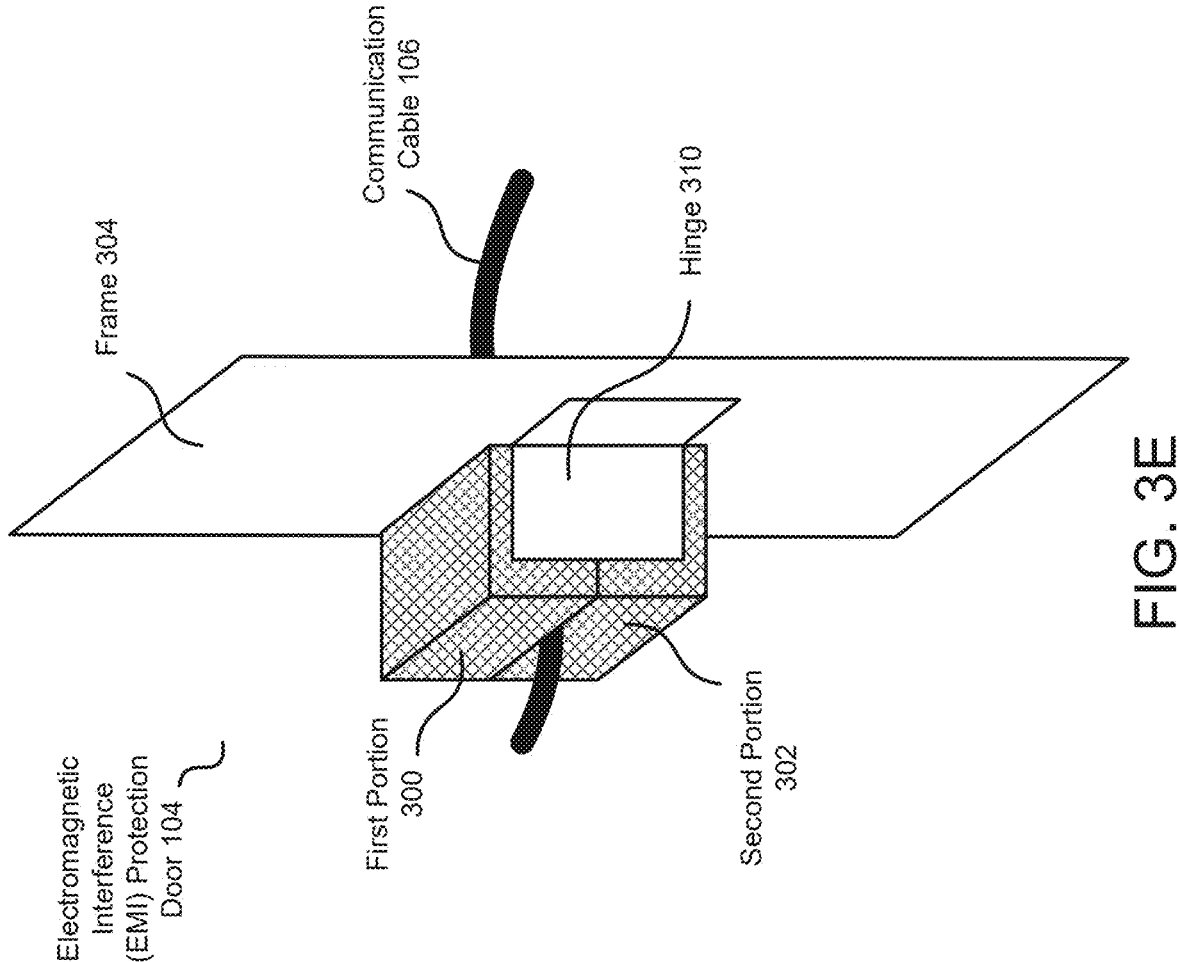

In a second example, EMI protection door 104 may include one hinge (e.g., the first hinge) and the first hinge may be connected to the first portion and the second portion of EMI protection door 104. The first hinge may be in the first position when EMI protection door 104 is closed and in the second position when EMI protection door 104 is open. The second portion of the first hinge (e.g., the portion that moves) may be connected to the first portion of EMI protection door 104 and the second portion of EMI protection door 104. Refer to FIGS. 3C-3E for additional details regarding EMI protection door 104 including the first hinge attached to the first portion and the second portion.

EMI protection door 104 may also include a frame adapted to establish a second EMI seal between EMI protection door 104 and enclosure 102. The frame may include a conductive material and may be shaped to fit a pre-defined area (e.g., an opening, an area around an opening) in enclosure 102 so that EMI protection door 104 substantially covers the opening in enclosure 102.

Therefore, communication cable 106 may exit enclosure 102 while maintaining an EMI seal with EMI protection door 104. By doing so, a likelihood of EMI negatively impacting operation of data processing system 100 may be decreased and a likelihood of providing the computer-implemented services as desired by a downstream consumer of the computer-implemented services may be increased.

Figure 2:
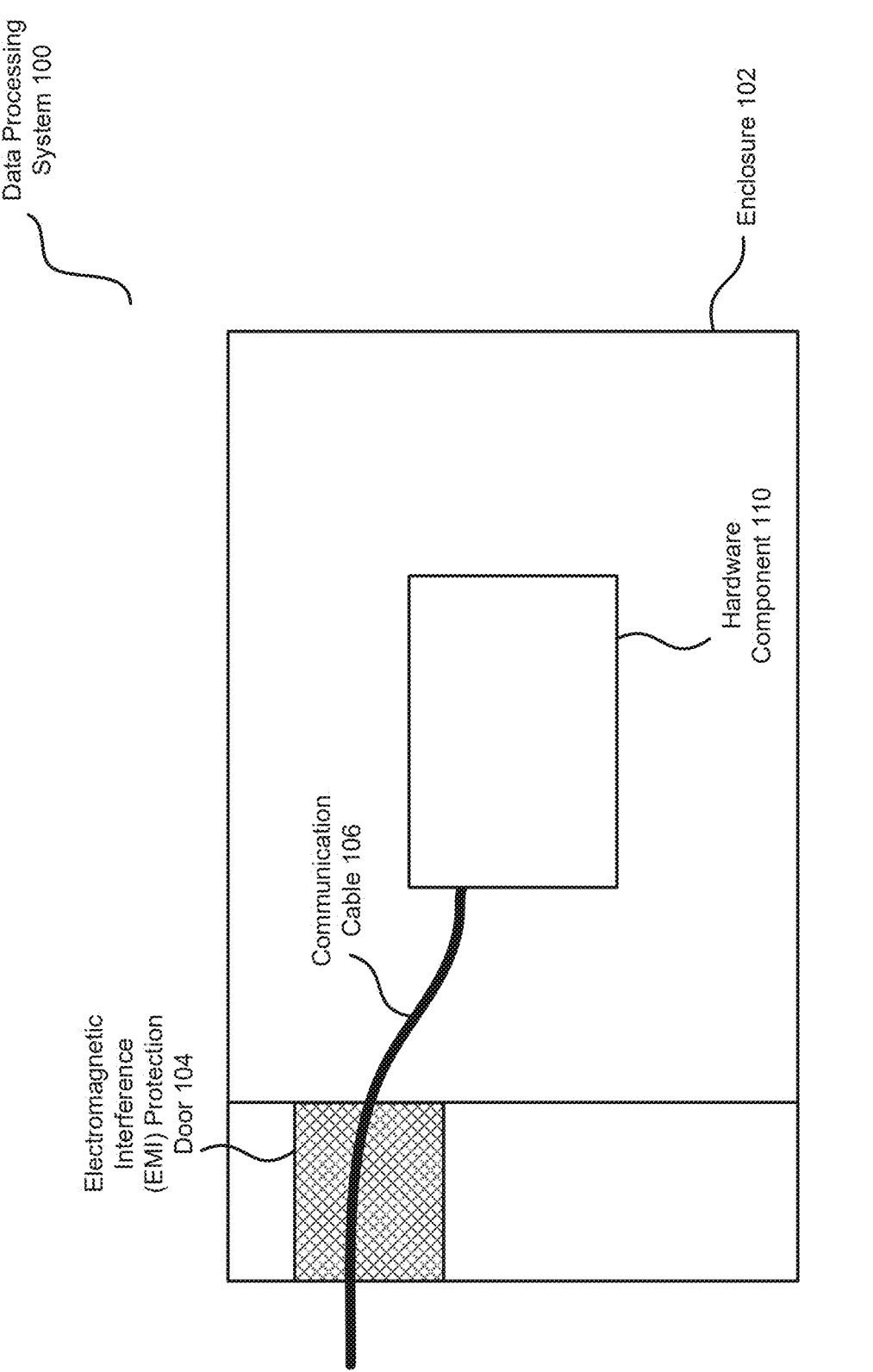
FIG. 2 shows a top view diagram illustrating a data processing system in accordance with an embodiment.

Turning to FIG. 2, a top view diagram of data processing system 100 in accordance with an embodiment is shown. As described in FIG. 1, data processing system 100 may include any number of hardware components (e.g., hardware component 110). During operation, hardware component 110 may provide, at least in part, computer-implemented services. The computer-implemented services may include any type and/or quantity of services.

While providing the computer-implemented services, hardware component 110 may exchange data with other hardware components of other data processing systems. To do so, data processing system 100 may include: (i) enclosure 102, (ii) hardware component 110, (iii) communication cable 106, and (iv) EMI protection door 104. Refer to FIG. 1 for a description of enclosure 102, communication cable 106, and EMI protection door 104.

Hardware component 110 may include any hardware component such as a processor, a memory module, a storage device, a communications device, and/or another type of devices. Hardware component 110 may be positioned inside enclosure 102 and may not be EMI sealed to any walls of enclosure 102. Therefore, communication cable 106 may attach to hardware component 110 and may pass through EMI protection door 104 to exit enclosure 102. Refer to FIGS. 3A-3E for additional details regarding EMI protection door 104.

Therefore, hardware component 110 may exchange any type and/or quantity of data with other hardware components of other data processing systems (not shown) while cooperatively providing the computer-implemented services. Hardware component 110 may exchange the data via communication cable 106 which may be EMI sealed with EMI protection door 104. Consequently, a likelihood of EMI negatively impacting the computer-implemented services may be decreased.

While described in FIG. 2 as including a limited number of components, it may be appreciated that data processing system 100 may include any number of components (e.g., additional hardware components, etc.) without departing from embodiments disclosed herein.

FIGS. 3A-3B show a first example of components of EMI protection door 104 and FIGS. 3C-3E show a second example of components of EMI protection door 104.

Turning to FIG. 3A, EMI protection door 104 is shown including a first hinge and a second hinge. EMI protection door 104 may include the first hinge and the second hinge so that EMI protection door 104 may be closed when the first hinge and the second hinge are in a first position and EMI protection door 104 may be open when the first hinge and the second hinge are in a second position. When EMI protection door 104 is closed, the electrically conductive material of EMI protection door 104 may form a first EMI seal with a communication cable passing through EMI protection door 104 and a second EMI seal with an enclosure of data processing system 100.

To do so, EMI protection door 104 may include: (i) first portion 300, (ii) second portion 302, (iii) first hinge 306, (iv) second hinge 308, and (v) frame 304. Each of these components is described below.

First portion 300 may be made of a conductive material (e.g., electrically conductive foam, electrically conductive filaments). A side of first portion 300 may be attached to a first portion of first hinge 306 and the first portion of first hinge 306 may be adapted to move between a first position and a second position.

A second portion of first hinge 306 may be attached to frame 304 and may not move when the first portion of first hinge 306 moves. When the first portion of first hinge 306 moves from the first position to the second position, first portion 300 may rotate via the side attached to the first portion of first hinge 306. In FIG. 3A, the first portion of first hinge 306 is shown in the second position (e.g., an open position).

Second portion 302 may also be made of the conductive material. A side of second portion 302 may be attached to a first portion of second hinge 308 and the first portion of second hinge 308 may be adapted to move between a first position and a second position. A second portion of second hinge 308 may be attached to frame 304 and may not move when the first portion of second hinge 308 moves. When the first portion of second hinge 308 moves from the first position to the second position, second portion 302 may also rotate via the side attached to the first portion of second hinge 308. In FIG. 3A, the first portion of second hinge 308 is shown in the second position (e.g., an open position).

Frame 304 may be positioned on any wall, lid, or base of the enclosure of data processing system 100, may form an EMI seal with the enclosure of data processing system 100, and may include a notched-out portion. When at least the first portion of first hinge 306 is in the second position, communication cable 106 may be threaded through a gap between first portion 300 and second portion 302 as at least a portion of the gap may overlap with the notched-out portion of frame 304.

First hinge 306 and second hinge 308 may be positioned on opposite sides of the gap between first portion 300 and second portion 302 so that first portion 300 and second portion 302 may rotate away from each other when first hinge 306 and second hinge 308 move to an open position (e.g., the second position) from a closed position (e.g., the first position).

Turning to FIG. 3B, EMI protection door 104 is shown including the first hinge and the second hinge. EMI protection door 104 may include the first hinge and the second hinge so that EMI protection door 104 may be closed when the first hinge and the second hinge are in a first position and EMI protection door 104 may be open when the first hinge and the second hinge are in a second position. When EMI protection door 104 is closed, the electrically conductive material of EMI protection door 104 may form an EMI seal with an enclosure of a data processing system and/or with a communication cable passing through EMI protection door 104.

In FIG. 3B, first hinge 306 and second hinge 308 are shown in the first position. When first hinge 306 and second hinge 308 are in the first position, the conductive material of first portion 300 and second portion 302 may form an EMI seal with communication cable 106. To do so, the conductive material of first portion 300 and second portion 302 may conform to a shape of a portion of communication cable 106 that is positioned in the gap between first portion 300 and second portion 302.

When communication cable 106 is not positioned in the gap between first portion 300 and second portion 302, the conductive material of first portion 300 and second portion 302 may substantially fill the gap (not shown). Consequently, internal components (e.g., hardware component 110) of data processing system 100 may be protected from EMI when communication cable 106 is positioned in the gap between first portion 300 and second portion 302 and when communication cable 106 is not positioned in the gap between first portion 300 and second portion 302.

Therefore, when first hinge 306 and second hinge 308 are in the first position, hardware component 110 may exchange data with another hardware component via communication cable 106 while maintaining an EMI seal with the enclosure of data processing system 100. Consequently, a likelihood that hardware components of data processing system 100 will operate as desired to provide the computer-implemented services may be increased.

Turning to FIG. 3C, EMI protection door 104 is shown including a single hinge (e.g., hinge 310). EMI protection door 104 may include hinge 310 so that EMI protection door 104 may be closed when hinge 310 is in a first position and EMI protection door 104 may be open when hinge 310 is in a second position. When EMI protection door 104 is closed, the electrically conductive material of EMI protection door 104 may form an EMI seal with an enclosure of a data processing system and/or with a communication cable passing through EMI protection door 104 as described in FIGS. 3A-3B.

In FIG. 3C, hinge 310 may be in the second position so that the notched-out portion of frame 304 is not EMI sealed by first portion 300 and second portion 302 (e.g., the notched-out portion being an opening in enclosure 102). Therefore, when hinge 310 is in the second position, communication cable 106 may pass through the notched-out portion of frame 304.

A first portion of hinge 310 be attached to both first portion 300 and second portion 302 so that the hinge 310 retains alignment of first portion 300 and second portion 302 as first portion 300 and second portion 302 rotate via hinge 310 (e.g., between the first and second position). A second portion of hinge 310 may be attached to frame 304 and may not move when the first portion of hinge 310 moves between the first and second position.

As described in FIGS. 3A-3B, first portion 300 and second portion 302 may be separated by a gap and may be adapted to fill the gap when communication cable 106 is not positioned in the gap. In FIG. 3C, communication cable 106 is shown positioned in the gap. To position communication cable 106 in the gap, communication cable 106 may be slid (e.g., horizontally in the orientation shown in FIG. 3C) into the gap via an edge of the gap between first portion 300 and second portion 302 to a middle of the gap. The middle of the gap may be any location within a length of the gap so that the EMI seal may be formed between first portion 300, second portion 302, and the portion of communication cable 106 positioned in the gap.

When communication cable 106 is positioned in the gap, first portion 300 and second portion 302 may be adapted to conform to a shape of a portion of communication cable 106 (e.g., the portion positioned in the gap). To do so, a portion of the conductive material of first portion 300 and second portion 302 may be deformed by the portion of communication cable 106.

Therefore, communication cable 106 may be connected to an internal component of enclosure 102 (not shown), may pass through the notched-out portion of frame 304, and may be inserted into the gap between first portion 300 and second portion 302. Consequently, the conductive material of first portion 300 and second portion 302 may form an EMI seal with communication cable 106.

Turning to FIG. 3D, hinge 310 is shown in the first position (e.g., the closed position) so that the notched-out portion of frame 304 is EMI sealed by first portion 300 and second portion 302. Therefore, when hinge 310 is in the second position, communication cable 106 may pass through the gap between first portion 300 and second portion 302 and an EMI seal may be maintained between communication cable 106 and EMI protection door 104.

Turning to FIG. 3E, a view of EMI protection door 104 from a second perspective is shown. The second perspective may be an opposite side view from the view shown in FIGS.

3C-3D. In FIG. 3E, hinge 310 is shown in the first position so that first portion 300 and second portion 302 are EMI sealed with frame 304 and with communication cable 106.

Figure 4:
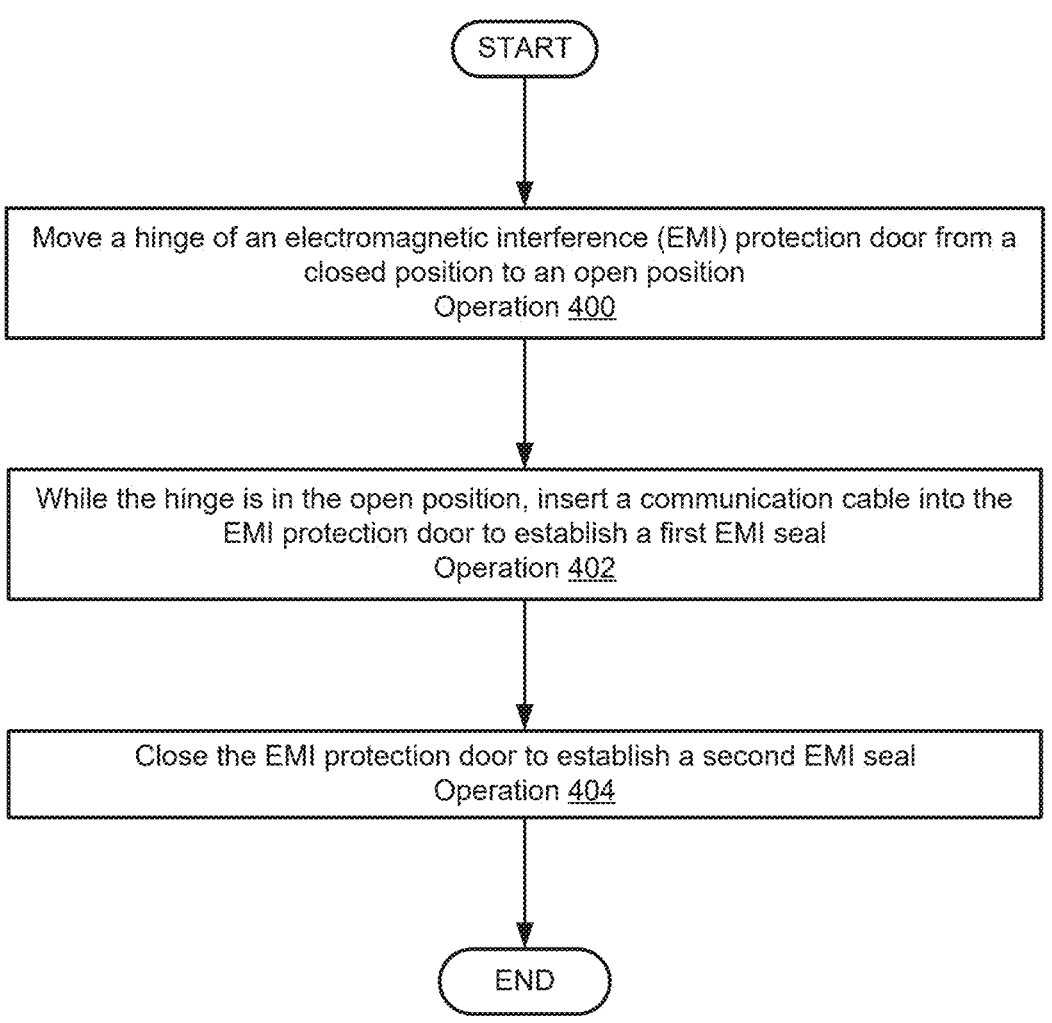
FIG. 4 shows a flow diagram illustrating a method of operating an EMI protection door of a data processing system in accordance with an embodiment.

As discussed above, the components of FIG. 1 may perform and be used in performance of various methods. FIG. 4 illustrates a method that may be performed with the components shown in FIGS. 1-3E. In the diagram discussed below and shown in FIG. 4, any of the operations may be repeated, performed in different orders, and/or performed in parallel with or in a partially overlapping in time manner with other operations.

Turning to FIG. 4, a flow diagram illustrating a method of operating an EMI protection door of a data processing system in accordance with an embodiment is shown. The method may be performed, for example, with any of the device shown in FIG. 1, various components of the devices, and/or other devices not shown in FIGS. 1-3E.

Prior to operation 400, a communication cable may be attached to a hardware component of the data processing system. The hardware component may be positioned inside an enclosure of the data processing system and may provide computer-implemented services via exchanging data with other hardware components of other data processing systems via the communication cable. To connect the communication cable to the other hardware components, the communication cable may need to exit the enclosure of the data processing system.

At operation 400, a hinge of the EMI protection door may be moved from a closed position (e.g., a first position) to an open position (e.g., a second position). Moving the hinge of the EMI protection door from the closed position to the open position may include: (i) applying force (e.g., by a technician or other individual responsible for operating the EMI protection door) to the EMI protection door, (ii) operating an opening mechanism for the EMI protection door, and/or (iii) other methods.

At operation 402, a communication cable may be inserted into the EMI protection door while the hinge is in the open position to establish a first EMI seal. In a first example, the hinge may be attached to a first portion and a second portion of the EMI protection door so that when the hinge is in the open position, an alignment of the first portion and the second portion is retained. There may be a gap between the first portion and the second portion.

Therefore, inserting the communication cable may include sliding the communication cable from an edge of the gap in the EMI protection door to a middle of the gap. The middle of the gap may be any location in a length of the gap so that the first EMI seal may be established. Conductive material of the first portion and the second portion may conform to a shape of the communication cable upon insertion of the communication cable so that a likelihood of EMI passing through the gap and into an enclosure of the data processing system may be reduced. The first EMI seal may be established via physical contact between the conductive material (e.g., of the first portion and the second portion) and the communication cable. Refer to FIGS. 3C-3E for a visual representation of the first example.

In a second example, the hinge may be attached to the first portion of the EMI protection door and a second hinge may be attached to the second portion of the EMI protection door so that an alignment between the first portion of the EMI protection door and the second portion of the EMI protection door is not retained when the hinge moves from the closed position to the open position. Refer to FIGS. 3A-3B for a visual representation of the second example. Therefore, in the second example, inserting the communication cable may include positioning the communication cable in a gap between the first portion and the second portion. Positioning the communication cable may include making physical contact between a first side of the communication cable and the second portion thereby establishing the first EMI seal between the second portion and the first side of the communication cable.

At operation 404, the EMI protection door may be closed to establish a second EMI seal. Closing the EMI protection door may include applying a force (e.g., by a technician) to the EMI protection door to move the hinge from the open position to the closed position. Closing the EMI protection door may also include operating a closing mechanism to move the hinge from the open position to the closed position. By doing so, an opening in the enclosure of the data processing system may be filled by the closed EMI protection door.

The second EMI seal may be established between the first portion, the second portion, and a frame attaching the EMI protection door to the enclosure of the data processing system. The frame may also establish a third EMI seal with the enclosure.

In the first example described in operation 402, the first and second portion may be re-positioned via rotating the hinge from the open position to the closed position. In the second example described in operation 402, the first portion may be re-positioned by the hinge so that the second EMI seal is established between a second half of the communication cable and the first portion of the EMI protection door. In the second example, the second EMI seal may be established by establishing physical contact between the second half of the communication cable and the conductive material of the first portion of the EMI protection door. Doing so may also close the opening in the enclosure thereby establishing an EMI seal between the EMI protection door and the enclosure.

The method may end following operation 404.

By doing so, the communication cable may be attached to a hardware component internal to the enclosure of the data processing system and may exit the enclosure to attach to another hardware component of a second data processing system. By passing through the EMI protection door as the communication cable exits the enclosure of the data processing system, a likelihood that EMI may interfere with operation of any hardware components of the data processing system may be reduced. Consequently, a likelihood of nominal operation of the data processing system and provision of computer-implemented services by the data processing system as desired may be increased.

Figure 5:
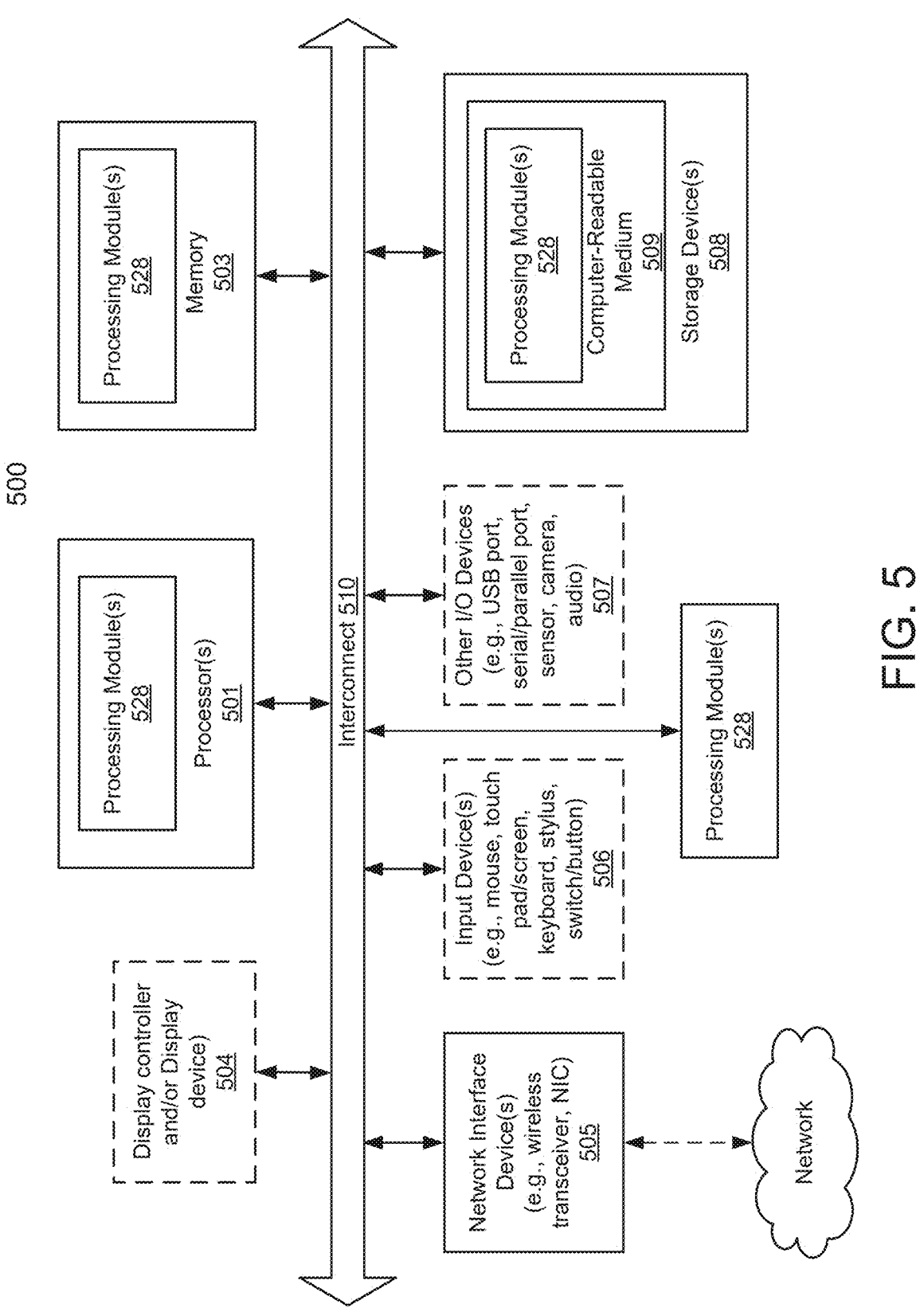
FIG. 5 shows a block diagram illustrating a data processing system in accordance with an embodiment.

Any of the components illustrated in FIGS. 1-3E may be implemented with one or more computing devices. Turning to FIG. 5, a block diagram illustrating an example of a data processing system (e.g., a computing device) in accordance with an embodiment is shown. For example, system 500 may represent any of data processing systems described above performing any of the processes or methods described above, and may include the illustrated components as well as any of the other components discussed with respect to FIGS. 1-3E.

System 500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 500 is intended to show a high-level view of many components of the computer system. However, it is to be understood that additional components may be present in certain implementations and furthermore, different arrangement of the components shown may occur in other implementations. System 500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 500 includes processor 501, memory 503, and devices 505-507 via a bus or an interconnect 510. Processor 501 may represent a single processor or multiple processors with a single processor core or multiple processor cores included therein. Processor 501 may represent one or more general-purpose processors such as a microprocessor, a central processing unit (CPU), or the like. More particularly, processor 501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a coprocessor, an embedded processor, or any other type of logic capable of processing instructions.

Processor 501, which may be a low power multi-core processor socket such as an ultra-low voltage processor, may act as a main processing unit and central hub for communication with the various components of the system. Such processor can be implemented as a system on chip (SoC). Processor 501 is configured to execute instructions for performing the operations discussed herein. System 500 may further include a graphics interface that communicates with optional graphics subsystem 504, which may include a display controller, a graphics processor, and/or a display device.

Processor 501 may communicate with memory 503, which in one embodiment can be implemented via multiple memory devices to provide for a given amount of system memory. Memory 503 may include one or more volatile storage (or memory) devices such as random-access memory (RAM), dynamic RAM (DRAM), synchronous DRAM (SDRAM), static RAM (SRAM), or other types of storage devices. Memory 503 may store information including sequences of instructions that are executed by processor 501, or any other device. For example, executable code and/or data of a variety of operating systems, device drivers, firmware (e.g., input output basic system or BIOS), and/or applications can be loaded in memory 503 and executed by processor 501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 500 may further include IO devices such as devices (e.g., 505, 506, 507, 508) including network interface device(s) 505, optional input device(s) 506, and other optional IO device(s) 507. Network interface device(s) 505 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 506 may include a mouse, a touch pad, a touch sensitive screen (which may be integrated with a display device of optional graphics subsystem 504), a pointer device such as a stylus, and/or a keyboard (e.g., physical keyboard or a virtual keyboard displayed as part of a touch sensitive screen). For example, input device(s) 506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 507 may include an audio device. An audio device may include a speaker and/or a microphone to facilitate voice-enabled functions, such as voice recognition, voice replication, digital recording, and/or telephony functions. Other IO devices 507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 510 via a sensor hub (not shown), while other devices such as a keyboard or thermal sensor may be controlled by an embedded controller (not shown), dependent upon the specific configuration or design of system 500.

To provide for persistent storage of information such as data, applications, one or more operating systems and so forth, a mass storage (not shown) may also couple to processor 501. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 501, e.g., via a serial peripheral interface (SPI). This flash device may provide for non-volatile storage of system software, including a basic input/output software (BIOS) as well as other firmware of the system.

Storage device 508 may include computer-readable storage medium 509 (also known as a machine-readable storage medium or a computer-readable medium) on which is stored one or more sets of instructions or software (e.g., processing module, unit, and/or processing module/unit/logic 528) embodying any one or more of the methodologies or functions described herein. Processing module/unit/logic 528 may represent any of the components described above. Processing module/unit/logic 528 may also reside, completely or at least partially, within memory 503 and/or within processor 501 during execution thereof by system 500, memory 503 and processor 501 also constituting machine-accessible storage media. Processing module/unit/logic 528 may further be transmitted or received over a network via network interface device(s) 505.

Computer-readable storage medium 509 may also be used to store some software functionalities described above persistently. While computer-readable storage medium 509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 528, components and other features described herein can be implemented as discrete hardware components or integrated in the functionality of hardware components such as ASICS, FPGAs, DSPs, or similar devices. In addition, processing module/unit/logic 528 can be implemented as firmware or functional circuitry within hardware devices. Further, processing module/unit/logic 528 can be implemented in any combination hardware devices and software components.

Note that while system 500 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system, comprising:

an enclosure;

a hardware component positioned in an interior of the enclosure;

a communication cable adapted to operably connect the hardware component to a second hardware component positioned in a second enclosure of a second data processing system; and an electromagnetic interference (EMI) protection door comprising a first portion, a second portion that is separated from the first portion by a gap, and a hinge that is rotatably connected to the first portion, the second portion, and the enclosure, wherein:

the EMI protection door is positioned with an opening in the enclosure and adapted to conform a shape of a portion of the EMI protection door to a shape of a portion of the communication cable while the communication cable is positioned with the portion of the EMI protection door to establish an EMI seal between the portion of the EMI protection door and the portion of the communication cable, the portion of the EMI protection door comprising the first portion and the second portion, and the first portion and the second portion are adapted to fill the gap while the communication cable is not positioned within the gap and adapted to conform to the shape of the portion of the communication cable while the communication cable is positioned within the gap, while the EMI protection door is open, the hinge is in an open position and the opening in the enclosure is exposed without being covered by the first portion and the second portion, and while the EMI protection door is closed, hinge is in a closed position and the opening in the enclosure is covered by the first portion and the second portion.

2. The data processing system of claim 1, wherein the first portion comprises a conductive material and the second portion comprises the conductive material, the conductive material forming the EMI seal while the communication cable is positioned in the gap.

3. The data processing system of claim 1, wherein the hinge is adapted to retain alignment of the first portion and the second portion as the first portion and the second portion rotate via the hinge.

4. The data processing system of claim of claim 2, wherein the conductive material comprises an electrically conductive foam.

5. The data processing system of claim of claim 2, wherein the conductive material comprises electrically conductive filaments.

6. The data processing system of claim of claim 2, wherein the EMI protection door further comprises:

a frame adapted to establish a second EMI seal between the EMI protection door and the enclosure.

7. The data processing system of claim 6, wherein the frame comprises a notched-out portion that corresponds to the opening in the enclosure.

8. The data processing system of claim 7, wherein, when the EMI protection door is closed, the communication cable is disposed within the notched-out portion of the frame and the notched-out portion of the frame is covered by the first portion and the second portion.

9. The data processing system of claim 1, wherein the hardware component is not EMI sealed to any walls of the enclosure.

10. The data processing system of claim 1, wherein the hinge is adapted to retain alignment of the first portion and the second portion as the first portion and the second portion rotate via the hinge.

11. An enclosure for a data processing system, comprising:

a receptacle for a hardware component, the receptacle being positioned in an interior of the enclosure;

an electromagnetic interference (EMI) protection door positioned with an opening in the enclosure to accommodate running of a communication cable from the hardware component to a second hardware component positioned in a second enclosure of a second data processing system, wherein:

the EMI protection door comprises a first portion, a second portion that is separated from the first portion by a gap, and a hinge that is rotatably connected to the first portion, the second portion, and the enclosure, the EMI protection door is adapted to conform a shape of a portion of the EMI protection door to a shape of a portion of the communication cable while the communication cable is positioned with the portion of the EMI protection door to establish an EMI seal between the portion of the EMI protection door and the portion of the communication cable, the portion of the EMI protection door comprising the first portion and the second portion, and the first portion and the second portion are adapted to fill the gap while the communication cable is not positioned within the gap and adapted to conform to the shape of the portion of the communication cable while the communication cable is positioned within the gap, while the EMI protection door is open, the hinge is in an open position and the opening in the enclosure is exposed without being covered by the first portion and the second portion, and while the EMI protection door is closed, hinge is in a closed position and the opening in the enclosure is covered by the first portion and the second portion.

12. The enclosure of claim 11, wherein the first portion comprises a conductive material and the second portion comprises the conductive material, the conductive material forming the EMI seal while the communication cable is positioned in the gap.

13. The enclosure of claim 12, wherein the hinge is adapted to retain alignment of the first portion and the second portion as the first portion and the second portion rotate via the hinge.

14. The enclosure of claim 12, wherein the conductive material comprises an electrically conductive foam.

15. The enclosure of claim 12, wherein the conductive material comprises electrically conductive filaments.

16. The enclosure of claim 12, wherein the EMI protection door further comprises:

a frame adapted to establish a second EMI seal between the EMI protection door and the enclosure.

17. The enclosure of claim 16, wherein the frame comprises a notched-out portion that corresponds to the opening in the enclosure.

18. The enclosure of claim 17, wherein, when the EMI protection door is closed, the communication cable is disposed within the notched-out portion of the frame and the notched-out portion of the frame is covered by the first portion and the second portion.

19. The enclosure of claim 11, wherein the hardware component is not EMI sealed to any walls of the enclosure.

20. The enclosure of claim 11, wherein the hinge is adapted to retain alignment of the first portion and the second portion as the first portion and the second portion rotate via the hinge.

* * * * *